(12) United States Patent
Kuo et al.

(10) Patent No.: US 11,056,324 B2
(45) Date of Patent: Jul. 6, 2021

(54) SYSTEM AND METHOD FOR PARTICLE CONTROL IN MRAM PROCESSING

(71) Applicant: Taiwan Semiconductor Manufacturing Co., Ltd., Hsin-Chu (TW)

(72) Inventors: Tsung-Han Kuo, New Taipei (TW); Po-Shu Wang, Hsinchu County (TW); Wei-Ming Wang, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/530,392

(22) Filed: Aug. 2, 2019

(65) Prior Publication Data

US 2020/0051799 A1    Feb. 13, 2020

Related U.S. Application Data

(60) Provisional application No. 62/718,050, filed on Aug. 13, 2018.

(51) Int. Cl.
*H01J 37/34* (2006.01)
*H01L 43/12* (2006.01)
(Continued)

(52) U.S. Cl.
CPC ......... *H01J 37/3458* (2013.01); *C23C 14/35* (2013.01); *H01J 37/3255* (2013.01);
(Continued)

(58) Field of Classification Search
CPC ............... H01J 37/3458; H01J 37/3255; H01J 37/32541; H01J 37/3405; H01J 2237/332;
(Continued)

(56) References Cited

U.S. PATENT DOCUMENTS

2004/0094402 A1 *  5/2004  Gopalraja ........... H01J 37/3408
                                                         204/192.12
2017/0110301 A1    4/2017  Lee et al.

FOREIGN PATENT DOCUMENTS

CN         1195035 A       10/1998
TW         201109457 A      3/2011

* cited by examiner

*Primary Examiner* — Kyoung Lee
(74) *Attorney, Agent, or Firm* — Duane Morris LLP

(57) ABSTRACT

A system and method for reducing particle contamination on substrates during a deposition process using a particle control system is disclosed here. In one embodiment, a film deposition system includes: a processing chamber sealable to create a pressurized environment and configured to contain a plasma, a target and a substrate in the pressurized environment; and a particle control unit, wherein the particle control unit is configured to provide an external force to each of at least one charged atom and at least one contamination particle in the plasma, wherein the at least one charged atom and the at last one contamination particle are generated by the target when it is in direct contact with the plasma, wherein the external force is configured to direct the at least one charged atom to a top surface of the substrate and to direct the at least one contamination particle away from the top surface of the substrate.

20 Claims, 5 Drawing Sheets

(51) Int. Cl.
*H01J 37/32* (2006.01)
*C23C 14/35* (2006.01)
(52) U.S. Cl.
CPC .... *H01J 37/32541* (2013.01); *H01J 37/3405* (2013.01); *H01L 43/12* (2013.01); *H01J 2237/332* (2013.01)
(58) Field of Classification Search
CPC .... H01J 37/32871; C23C 14/35; C23C 14/54; C23C 14/357; C23C 14/3471; C23C 14/354; C23C 14/225; C23C 14/358; C23C 14/3407; C23C 14/46; H01L 43/12
See application file for complete search history.

SYSTEM AND METHOD FOR PARTICLE CONTROL IN MRAM PROCESSING

BACKGROUND

Magnetoresistive random-access memory (MRAM) is a non-volatile random-access memory technology and typically, such memory is fabricated by depositing multiple layers of materials using a physical vapor deposition system under vacuum. During deposition, the multiple layers of materials can be contaminated by system- or process-related contamination. One of the primary types of contamination is target-related, such as particles (e.g., flakes) from a surface of a target. This target-related contamination is typically caused by arcing, non-homogeneity in morphology and composition, etc. These particles in the deposited film can affect the film growth, its properties, as well as device performance adversely. Therefore, a method and system that can effectively prevent particle contamination during a film deposition process is needed. Despite this long felt need, no suitable systems meeting these requirements are available.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

Figure 1A:
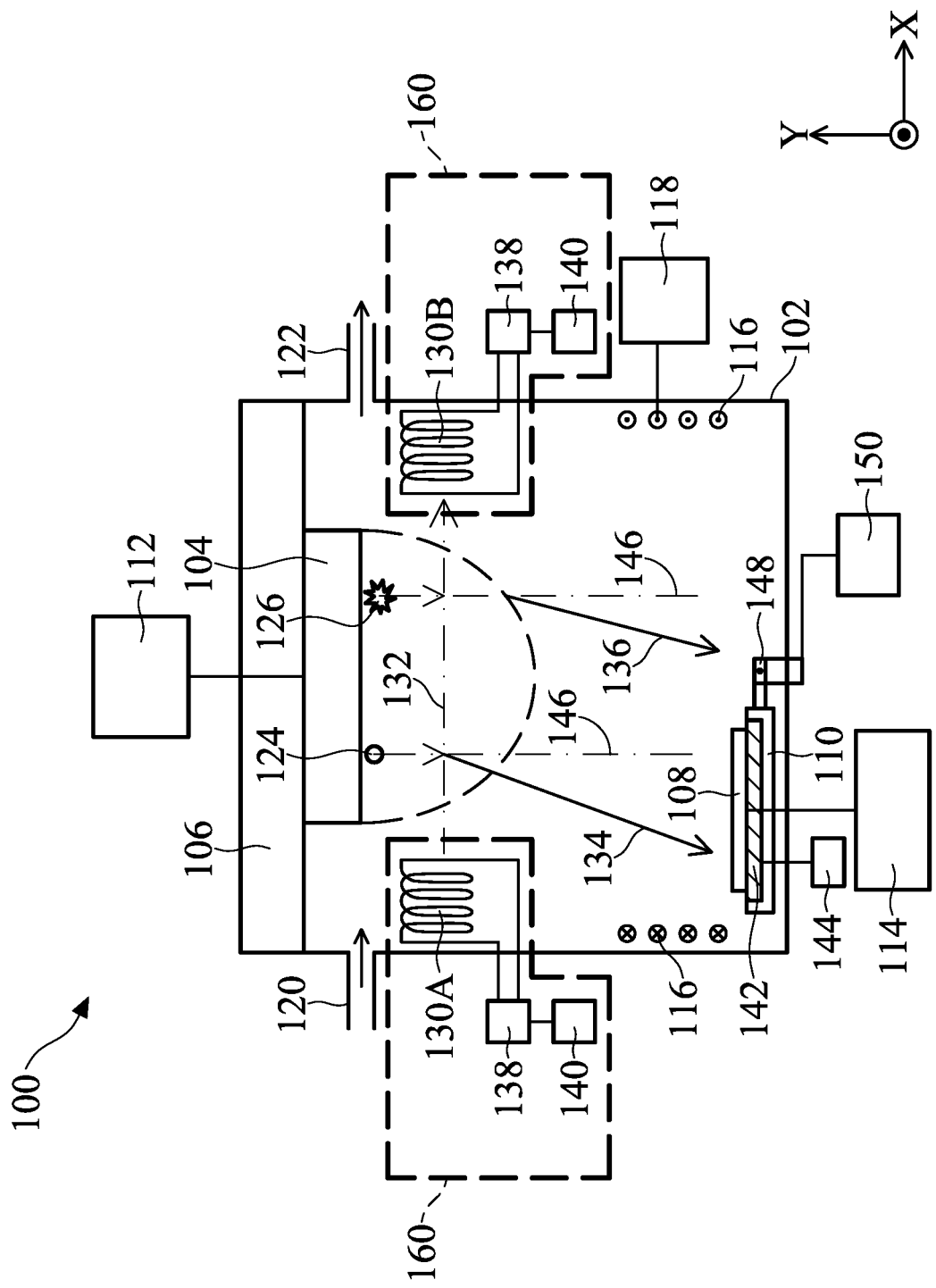
FIG. 1A illustrates a cross-sectional view of a physical vapor deposition system with a particle control system, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The presented disclosure provides various embodiments of a method and system for removing particle contamination on a substrate during a film deposition process. During deposition, the multiple layers of materials can be contaminated by system- or process-related contamination. One of the primary types of contamination is target-related, such as particles (e.g., flakes) from a surface of a target. This target-related contamination is typically caused by arcing, non-homogeneity in morphology and composition, etc. These particles in the deposited film can affect the film growth, its properties, as well as device performance adversely. A system and method to effectively remove particle contamination during a deposition process is presented. Accordingly, the above-mentioned issues may be advantageously avoided.

This description of the exemplary embodiments is set to be understood in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIG. 1A illustrates a cross-sectional view of a physical vapor deposition system 100 with a particle control system 160, in accordance with some embodiments of the present disclosure. The processing chamber 102 comprises at least one target 104 bonded on at least one plasma cathode 106. In the illustrated embodiment, at least one gas-feeding port 120 connected to at least one gas supply line (not shown), and at least one vacuum port 122 connected to a pressure control unit, e.g., a pump and a pressure gauge. In some embodiments, the pressure control unit is able to provide an environment in the processing chamber 102 with a pressure of a few millitorr (mTorr) to a few Torr.

In some embodiments, gas through the at least one gas-feeding port 120 to the processing chamber 102 may include at least one or a combination of $O_2$, Ar, $N_2$, $H_2$, $NH_3$, $N_2O$, $CF_4$, $SF_6$, $CCl_4$, $CH_4$, $H_2S$, $SiH_4$, metal-containing precursors, etc. For example, process gas (e.g., Ar) is added to the processing chamber 102 through the at least one gas-feeding port 120 and pumped out by a pump through the at least one vacuum port 122. In some embodiments, the at least one gas-feeding port 120 can be located in close proximity to the target 104 (e.g., behind the cathode). The at least one plasma cathode 106 each is coupled to a power source 112. In some other embodiments, the power source 112 comprises a radio frequency (RF) power source and a respective matching circuit (both are not shown) operating at frequencies from a few tens of kilohertz (KHz) to tens of megahertz (MHz). By applying a power on the at least one plasma cathode 106, a plasma 128 (i.e., a gas that contains ionized atoms or molecules) can be formed in a space in the processing chamber 102 near the at least one target 104. In some embodiments, technologies, such as for instance inductively coupled plasma, electron cyclotron resonance, microwave, and helicon wave can be integrated with the RF source for a creation of high-density discharges for desired deposition properties. In some embodiments, the physical vapor deposition system 100 can be a DC magnetron sputtering system configured in a cathode target/anodic shield arrangement, wherein the at least one plasma cathode 106 and anode (not shown) are connected to a DC discharge power supply 112. In some embodiments, the at least one target 104 and the at least one corresponding plasma cathode 106 can be cooled by a coolant running behind the target 104.

In the illustrated embodiment, the processing chamber 102 further comprises a wafer stage 110 with a substrate 108. In some embodiments, the wafer stage 110 is further coupled to a power source 114 in order to attract positively charged particles 124 in the plasma 128 bombarded off the surface of the target 104 by charged processing gas molecules (e.g., Ar+). The back of the wafer stage 110 can be coupled to electrical ground, in some embodiments. In some embodiments, the wafer stage 110 is also coupled to the power source 114, e.g., an RF power source 114. By applying an AC voltage between the plasma cathode 106 and the wafer stage 110, the plasma 128 can be formed on the target 104 and may extend across the space between the target 104 and the wafer stage 110 to the surface of the substrate 108, in accordance with some embodiments. The processing chamber 102 may further comprise induction coils 116 which is coupled to an RF power source 118 to create a magnetic field along the y-axis of the processing chamber 102 so as to facilitate the formation of the plasma 128.

Although not shown in the figure, for the ones with ordinary skill in the art it is understandable that the processing chamber 102 may be also equipped with a plurality of pressure gauges, thickness monitor systems (quartz crystal monitor, spectroscopic ellipsometer, reflection high-energy electron diffraction detector (RHEED)), shutters, a rotational manipulator, viewports, transfer ports, etc.

In some embodiments, the processing chamber 102 further comprises a particle control system 160. In some embodiments, the particle control system 160 comprises at least one magnet pair 130 configured inside the processing chamber 102. In some embodiments, the at least one magnet pair 130 each comprises two electromagnets 130A and 130B with magnetic coils configured facing each other on the opposite side of the processing chamber 102. Each of the electromagnets in a magnet pair 130 comprise a conductive wire coil that acts as a magnet when an electric current passes through it. In some embodiments, the conductive wire coil is wrapped around a core of ferromagnetic materials which can be used to enhance the magnetic field produced by the coil. In some embodiments, the at least one magnet pair 130 is coupled to a power source 138 and further to a control unit 140. In some embodiments, the control unit 140 and the power source 138 are configured to control a magnitude and a direction of an electric current running through the magnetic coils of the two electromagnets 130A/130B in each of the at least one magnet pair 130 so as to adjust a strength and a direction of the magnetic field 132 between the 2 electromagnets in the magnet pair 130. A magnetic force is induced by the magnetic field 132 on moving and charged particles (e.g., the positively charged particle 124) from the target 104. For example, a positively charged target atom 124 for deposition on the substrate 108 and a positively charged contamination particle 126 are bombarded off the surface of the target 104. In some embodiments, the positively charged target atom 124 and the positively charged contamination particle 126 each has an initial trajectory 146 without the magnetic field 132 provided by the magnet pair 130 of the particle control system 160. When the magnetic field 132 with a direction from a first electromagnet 130A to a second electromagnet 130B is enabled, the positively charged target atom 124 and the positively charged contamination particle 126 each has a second trajectory 134 and 136, respectively. In some embodiments, the second trajectory 134/136 are caused by the electromagnetic force applied on the particles 124/126. The difference between the original trajectory and the second trajectory is greater on the positively charged target atom 124 than that of the positively charged contamination particle 126 caused by differences between the two particles, for example mass and electric charge. Therefore, the magnetic force can change original trajectories of charged particles and thus separate contamination particles from the rest of the target atoms 124 so as to reduce the contamination in the deposited film.

In some other embodiments, the at least one magnet pair 130 comprises a pair of permanent magnets. In some embodiments, the permanent magnets comprises ferromagnetic materials that can produce persistent magnetic field.

Referring to FIG. 1A, the wafer stage 110 in the physical vapor deposition system 100 is positioned off the center of the processing chamber 102. In some embodiments, the wafer stage 110 is coupled to a mechanical transfer arm 148. The mechanical transfer arm 148 coupled to the wafer stage 110 can be controlled by a control unit 150 so as to adjust the position of the wafer stage 110 in the processing chamber 102 according to positions of target atoms.

The wafer stage 110 in the physical vapor deposition system 100 can further equipped with a plurality of temperature control elements 142. The temperature control elements 142 are controlled by a temperature control unit 144. The temperature control unit 144 can be located within a processing chamber 102 enclosed in a Faraday shield to protect electronic circuits from RF interference or outside the processing chamber 102.

According to the exemplary embodiment described herein, the physical vapor deposition system 100 can be used in processing the surface layers of the substrate 108. For example, any of a photoresist layer, mask layer, or other layer of a semiconductor wafer as desired, can be processed before or after an etch step, or any combination thereof, according to a specified recipe. The recipe also specifies parameters used to establish the proper environment in the processing chamber 102 for realizing the desired features and feature dimensions on the substrate 108. The recipe can specify a type of reactant gas to be introduced into the plasma chamber and its flow rate, a pressure during reaction, a power and frequency of the RF signal provided to the plasma cathode 106 or the wafer stage 110.

The substrate 108 may be a bulk silicon substrate although other semiconductor materials including group III, group IV, and group V elements may also be used. Alternatively, the substrate may be a silicon-on-insulator (SOI) substrate. In some embodiments, a device layer may be a polysilicon layer disposed on a substrate (not shown) for the formation of one or more polysilicon gates in the substrate 108. In another embodiment, the device layer may be a metallization layer such as an inter-layer dielectric (ILD) or an inter-metal dielectric layer (IMD) for forming interconnect structures (e.g., metal lines and/or vias). In yet other embodiments, the device layer may be any layer in the substrate 108 that may be patterned using photolithography and etching processes. The substrate 108 may include numerous device layers. Furthermore, the device layer may include a buffer layer (e.g., an oxide interfacial layer, not shown), an etch stop layer (e.g., a silicon nitride layer, a silicon carbide layer, or the like), or the like. A hard mask may be formed over the device layer for use as a patterning mask. The hard mask may comprise an oxide, silicon oxynitride (SiON), silicon nitride ($Si_3N_4$), titanium nitride (TiN), or the like.

Figure 1B:
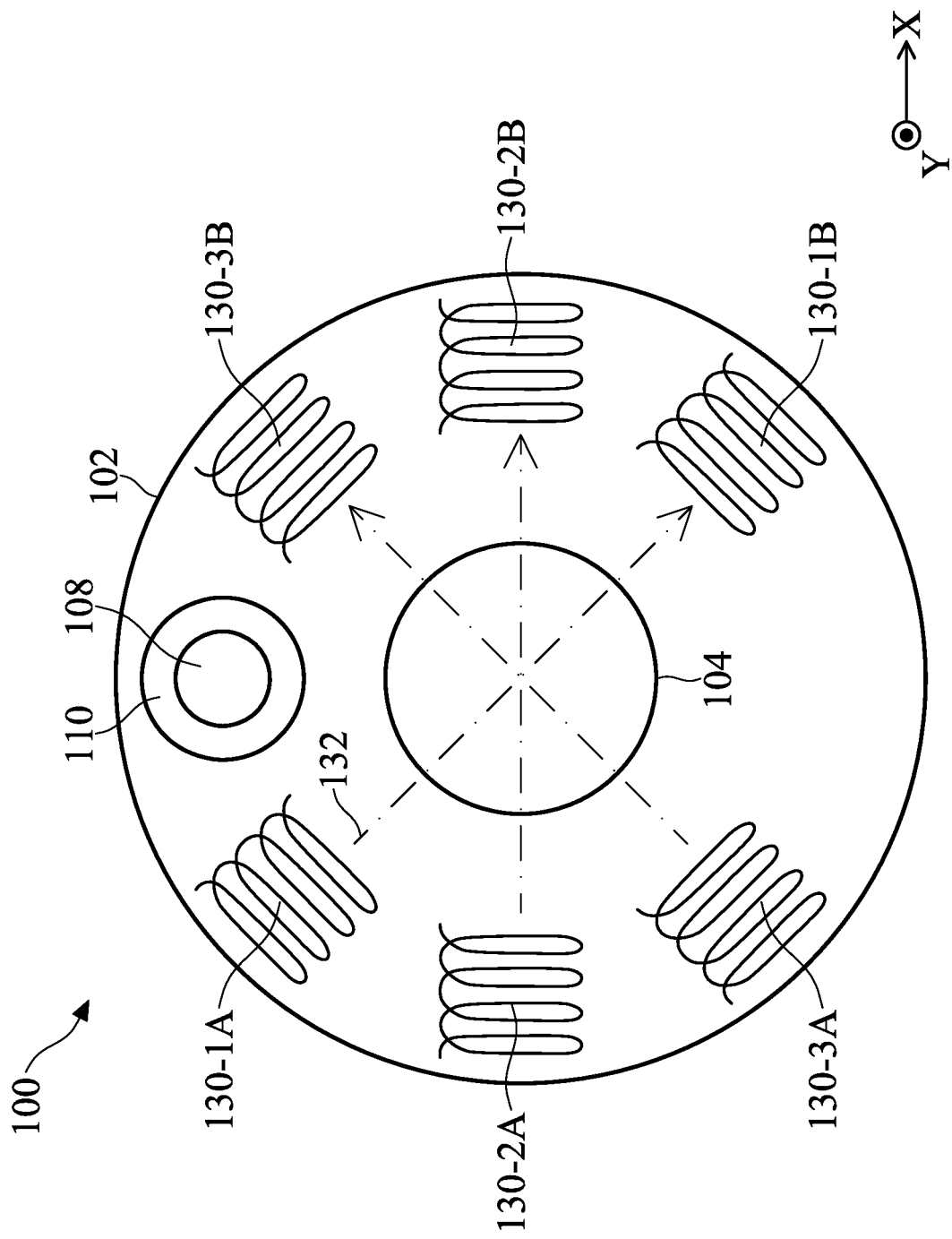
FIG. 1B illustrates a top-view of a physical vapor deposition system with a particle control system, in accordance with some embodiments of the present disclosure.

FIG. 1B illustrates a top-view of a physical vapor deposition system 100 with a particle control system 160, in accordance with some embodiments of the present disclosure. In the illustrated embodiment, the particle control system 160 in a processing chamber 102 comprises three magnetic pairs, 130-1, 130-2 and 130-3. Although the deposition system 100 comprises 3 magnetic pairs, it should be noted that the system 100 can comprise any number of magnetic pairs which is within the scope of this invention. In some embodiments, the three magnetic pairs 130 each comprises two electromagnetic coils, e.g., 130-1A and 130-1B. In some embodiments, each of the electromagnetic coils has a circular shape or a square shape. In some embodiments, the processing chamber 102 has a diameter of 50-60 centimeters. In some embodiments, each of the electromagnetic coils comprises 10-20 turns and a diameter in a range of 30-40 centimeters. In some embodiments, the electromagnetic coil each comprises at least one of the following metals: iron and manganese. In some embodiments, the 3 magnet pairs 130 are arranged around the inner wall of the processing chamber 102 and each of the 3 magnetic pairs 130 has a 2-fold rotational symmetry about the center of the processing chamber 102. In some embodiments, the system 100 comprises at least one target 104 at the center of the processing chamber 102. In some embodiments, the system 100 further comprises a wafer stage 110 with a substrate 108. In some embodiments, the wafer stage 110 is off the center of the processing chamber 102 and located at the top of the processing chamber in a top view so as to collect positively charged target atoms 124 that are shifted by the magnetic field 132 generated by the 3 magnet pairs 130.

Figure 2A:
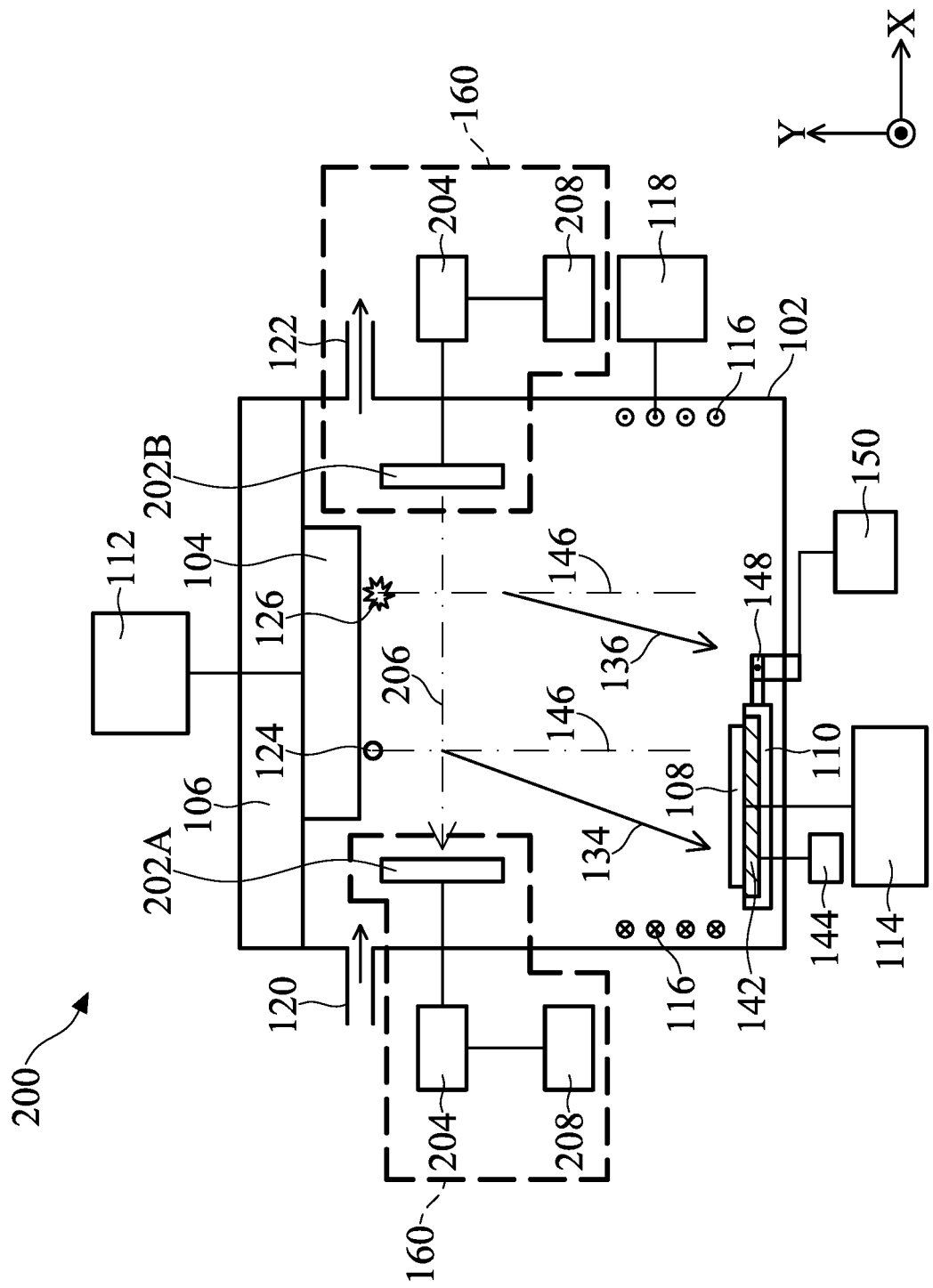
FIG. 2A illustrates a cross-sectional view of a physical vapor deposition system with a particle control system, in accordance with some embodiments of the present disclosure.

FIG. 2A illustrates a cross-sectional overview of a physical vapor deposition system 100 with a particle control system, in accordance with some embodiments of the present disclosure. The processing chamber 102 comprises at least one target 104 bonded on at least one plasma cathode 106. In the illustrated embodiment, at least one gas-feeding port 120 connected to at least one gas supply line (not shown), and at least one vacuum port 122 connected to a pressure control unit, e.g., a pump and a pressure gauge. In some embodiments, the pressure control unit is able to provide an environment in the processing chamber 102 with a pressure of a few millitorr (mTorr) to a few Torr.

In some embodiments, the gas through the gas-feeding port 120 to the processing chamber 102 may include at least one or a combination of $O_2$, Ar, $N_2$, $H_2$, $NH_3$, $N_2O$, $CF_4$, $SF_6$, $CCl_4$, $CH_4$, $H_2S$, $SiH_4$, metal-containing precursors, etc. For example, process gas (e.g., Ar) is added to the processing chamber through the at least one gas-feeding port 120 and pumped out by a pump through the at least one vacuum port 122. In some embodiments, the at least one gas-feeding port 120 can be located in close proximity to the target 104 (e.g., behind the cathode). The at least one plasma cathode 106 each is coupled to a discharge power source 112. In some other embodiments, the discharge power source 112 comprises a radio frequency (RF) power source and a respective matching circuit (both are not shown) operating at frequencies from a few tens of kilohertz (KHz) to tens of megahertz (MHz). By applying a power on the at least one plasma cathode 106, a plasma 128 (i.e., a gas that contains ionized atoms or molecules) can be formed in a space in the processing chamber 102 near the at least one target 104. In some embodiments, technologies, such as for instance inductively coupled plasma, electron cyclotron resonance, microwave, and helicon wave can be integrated with the RF source for a creation of high-density discharges for desired deposition properties. In some embodiments, the physical vapor deposition system 100 can be a DC magnetron sputtering system configured in a cathode target/anodic shield arrangement, wherein the at least one plasma cathode 106 and anode (not shown) are connected to a DC discharge power supply 112. In some embodiments, the at least one target 104 and the at least one corresponding plasma cathode 106 can be cooled by a coolant running behind the target 104.

In the illustrated embodiment, the processing chamber 102 further comprises a wafer stage 110 with a substrate 108. In some embodiments, the wafer stage 110 is further coupled to a power source 114 in order to attract positively charged particles 124 in the plasma 128 bombarded off the surface of the target 104 by charged processing gas molecules (e.g., $Ar^+$). The back of the wafer stage 110 can be coupled to electrical ground, in some embodiments. In some embodiments, the wafer stage 110 is also coupled to the power source 114, e.g., an RF power source 114. By applying an AC voltage between the plasma cathode 106 and the wafer stage 110, the plasma 128 can be formed on the target 104 and may extend across the space between the target 104 and the wafer stage 110 to the surface of the substrate 108, in accordance with some embodiments. The processing chamber 102 may further comprise induction coils 116 which is coupled to an RF power source 118 to create a magnetic field along the y-axis of the processing chamber 102 so as to facilitate the formation of the plasma 128.

Although not shown in the figure, for the ones with ordinary skill in the art it is understandable that the processing chamber 102 may be also equipped with a plurality of pressure gauges, thickness monitor systems (quartz crystal monitor, spectroscopic ellipsometer, reflection high-energy electron diffraction detector (RHEED)), shutters, a rotational manipulator, viewports, transfer ports, etc.

In some embodiments, the particle control system 160 comprises at least one electrode pair 202 configured inside the processing chamber 102. In some embodiments, the at least one electrode pair 202 each comprises two electrodes 202A and 202B with electrodes configured facing each other on the opposite side of the processing chamber 102. Each of the electrode pair 202 acts as a capacitor when an electric potential is applied between the two electrodes. In some embodiments, the at least one electrode pair 202 is coupled to a power source 204 and further to a control unit 208. In some embodiments, the control unit 208 and the power source 204 are configured to control a magnitude and a polarity of the electric potential so as to control a strength and a direction of an electric field 206 between the two electrodes 202A/202B. An electrostatic force is induced by the electric field 206 on a moving and charged particle (e.g., a positively charged target atom 124 and a positively charged contamination particle 126) from the target 104. For example, the positively charged target atom 124 for deposition on the substrate 108 and the positively charged contamination particle 126 are bombarded off the surface of the target 104. In some embodiments, the positively charged target atom 124 and the positively charged contamination particle 126 each has an initial trajectory 146 when there is no electric field 206 applied between the two electrodes 202A/202B. When the electric field 206 with a direction from a first electrode 202A to a second electrode 202B is enabled by applying an electric potential on the 2 electrodes 202A/202B, the positively charged target atom 124 and the positively charged contamination particle 126 are shifted by the electrostatic force resulting in second trajectories 134 and 136, respectively. The difference between the original trajectory and the second trajectory of the positively charged target atom 124 is greater than that of the positively charged contamination particle 126 caused by differences between the 2 particles, for example mass and electric charges. Therefore, the electrostatic force provided by the particle control system 160 can change original trajectories of charged particles and thus separate contamination particles 126 from the rest of the target atoms 124.

Referring to FIG. 2A, the wafer stage 110 in the physical vapor deposition system 100 is positioned off the center of the processing chamber 102. In some embodiments, the wafer stage 110 is coupled to a mechanical transfer arm 148. The mechanical transfer arm 148 coupled to the wafer stage 110 can be controlled by a control unit 150 so as to adjust the position of the wafer stage 110 in the processing chamber 102 according to positions of target atoms.

The wafer stage 110 in the physical vapor deposition system 100 can further equipped with a plurality of temperature control elements 142. The temperature control elements 142 are controlled by a temperature control unit 144. The temperature control unit 144 can be located within a processing chamber 102 enclosed in a Faraday shield to protect electronic circuits from RF interference or outside the processing chamber 102.

According to the exemplary embodiment described herein, the physical vapor deposition system 100 can be used in processing the surface layers of the substrate 108. For example, any of a photoresist layer, mask layer, or other layer of a semiconductor wafer as desired, can be processed before or after an etch step, or any combination thereof, according to a specified recipe. The recipe also specifies parameters used to establish the proper environment in the processing chamber 102 for realizing the desired features and feature dimensions on the substrate 108. The recipe can specify a type of reactant gas to be introduced into the plasma chamber and its flow rate, a pressure during reaction, a power and frequency of the RF signal provided to the plasma cathode 106 or the wafer stage 110.

The substrate 108 may be a bulk silicon substrate although other semiconductor materials including group III, group IV, and group V elements may also be used. Alternatively, the substrate may be a silicon-on-insulator (SOI) substrate. In some embodiments, a device layer may be a polysilicon layer disposed on a substrate (not shown) for the formation of one or more polysilicon gates in the substrate 108. In another embodiment, the device layer may be a metallization layer such as an inter-layer dielectric (ILD) or an inter-metal dielectric layer (IMD) for forming interconnect structures (e.g., metal lines and/or vias). In yet other embodiments, the device layer may be any layer in the substrate 108 that may be patterned using photolithography and etching processes. The substrate 108 may include numerous device layers. Furthermore, the device layer may include a buffer layer (e.g., an oxide interfacial layer, not shown), an etch stop layer (e.g., a silicon nitride layer, a silicon carbide layer, or the like), or the like. A hard mask may be formed over the device layer for use as a patterning mask. The hard mask may comprise an oxide, silicon oxynitride (SiON), silicon nitride ($Si_3N_4$), titanium nitride (TiN), or the like.

Figure 2B:
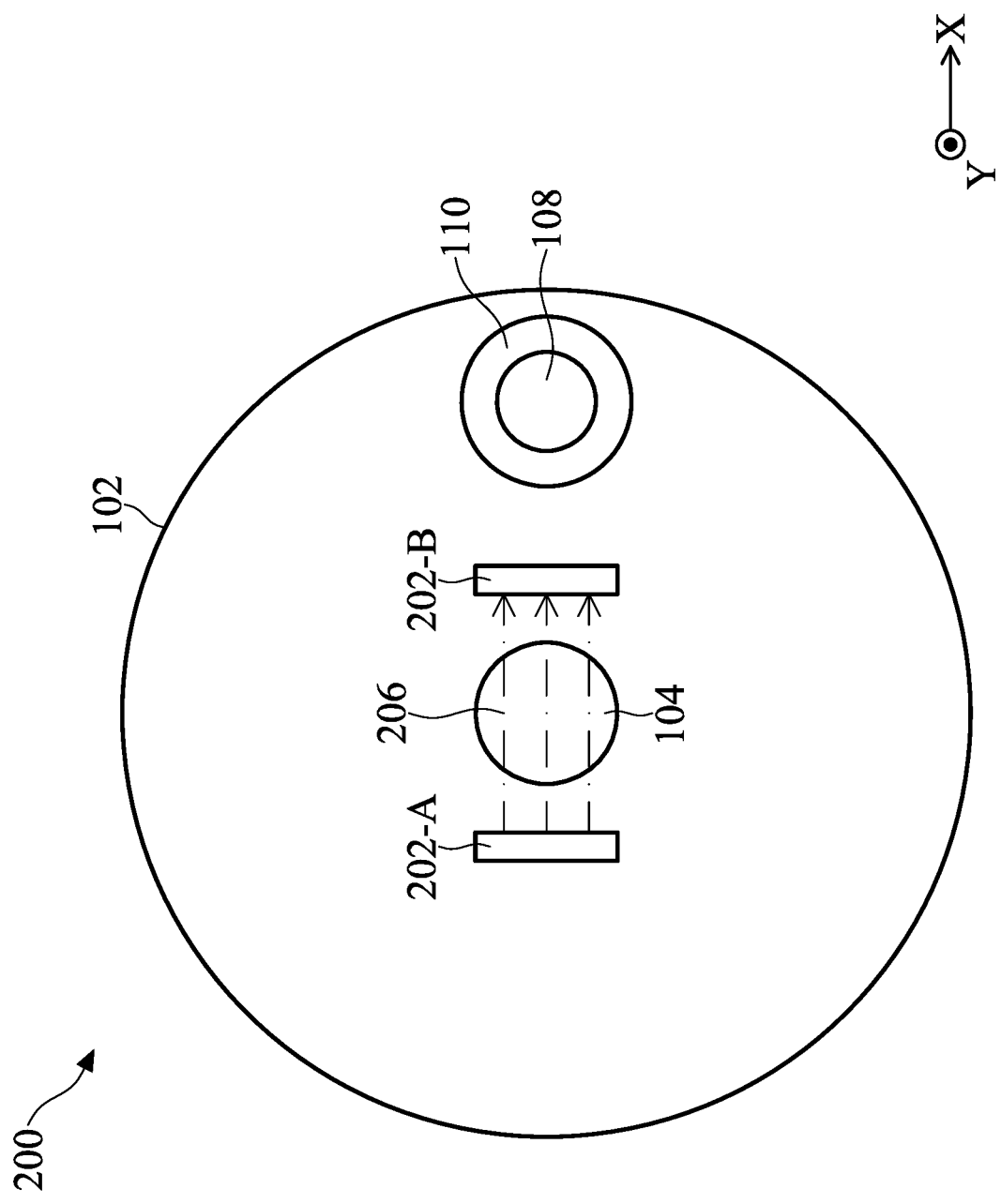
FIG. 2B illustrates a top-view of a physical vapor deposition system with a particle control system, in accordance with some embodiments of the present disclosure.

FIG. 2B illustrates a top-view of a physical vapor deposition system 100 with a particle control system 160, in accordance with some embodiments of the present disclosure. In the illustrated embodiment, the particle control system 160 comprises 1 electrode pair 202. Although the deposition system 100 comprises 1 electrode pair, it should be noted that the deposition system 100 can comprise any number of electrode pairs 202 which is within the scope of this invention. In some embodiments, the electrode pair 202 comprises two electrodes 202A and 202B. In some embodiments, the processing chamber 102 has a diameter of 50-60 centimeters. In some embodiments, each of the electrodes has a circular shape and has a diameter of 10 centimeters. In some embodiments, each of the electrodes has a square shape and the size of the electrode is 100 square centimeters. In some embodiments, each of the electrode comprises at least one of the following: iron and manganese. In some embodiments, the electrode pair 202 is arranged around the target 104 in the processing chamber 102 and has a 2-fold rotational symmetry about the center of the processing chamber 102. In some embodiments, the deposition system 100 comprises at least one target 104 at the center of the processing chamber 102. In some embodiments, the deposition system 100 comprises a wafer stage 110 with a substrate 108. In some embodiments, the wafer stage 110 is off the center of the processing chamber 102 and located at the right side of the processing chamber in a top view so as to collect target atoms 124 that are shifted by the electric field 206 generated by the electrode pair 202.

As discussed above in FIGS. 1 and 2, the control units 140, 144, 150, and 208 are representative devices and each may comprise a processor, a memory, an input/output interface, a communications interface, and a system bus. The processor may comprise any processing circuitry operative to control the operations and performance of the control units 140, 144, 150, and 208. In various aspects, the processor may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor also may be implemented by a controller, a microcontroller, an application specific integrated circuit (ASIC), a field programmable gate array (FPGA), a programmable logic device (PLD), and so forth.

In various aspects, the processor may be arranged to run an operating system (OS) and various applications. Examples of an OS comprise, for example, operating systems generally known under the trade name of Apple OS, Microsoft Windows OS, Android OS, and any other proprietary or open source OS. Examples of applications comprise, for example, a telephone application, a camera (e.g., digital camera, video camera) application, a browser application, a multimedia player application, a gaming application, a messaging application (e.g., email, short message, multimedia), a viewer application, and so forth.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory.

In some embodiments, the memory may comprise any machine-readable or computer-readable media capable of storing data, including both volatile/non-volatile memory and removable/non-removable memory. The memory may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the control units 140, 144, 150, and 208.

For example, memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory may contain an instruction set, in the form of a file for executing a method of generating one or more timing libraries as described herein. The instruction set may be stored in any acceptable form of machine-readable instructions, including source code or various appropriate programming languages. Some examples of programming languages that may be used to store the instruction set comprise, but are not limited to: Java, C, C++, C#, Python, Objective-C, Visual Basic, or .NET programming. In some embodiments a compiler or interpreter is comprised to convert the instruction set into machine executable code for execution by the processor.

In some embodiments, the I/O interface may comprise any suitable mechanism or component to at least enable a user to provide input to the control units 140, 144, 150, and 208, and the control units 140, 144, 150, and 208 to provide output to the user. For example, the I/O interface may comprise any suitable input mechanism, including but not limited to, a button, keypad, keyboard, click wheel, touch screen, or motion sensor. In some embodiments, the I/O interface may comprise a capacitive sensing mechanism, or a multi-touch capacitive sensing mechanism (e.g., a touchscreen).

In some embodiments, the I/O interface may comprise a visual peripheral output device for providing a display visible to the user. For example, the visual peripheral output device may comprise a screen such as, for example, a Liquid Crystal Display (LCD) screen, incorporated into the control units 140, 144, 150, and 208. As another example, the visual peripheral output device may comprise a movable display or projecting system for providing a display of content on a surface remote from the control units 140, 144, 150, and 208. In some embodiments, the visual peripheral output device can comprise a coder/decoder, also known as a Codec, to convert digital media data into analog signals. For example, the visual peripheral output device may comprise video Codecs, audio Codecs, or any other suitable type of Codec.

The visual peripheral output device also may comprise display drivers, circuitry for driving display drivers, or both. The visual peripheral output device may be operative to display content under the direction of the processor. For example, the visual peripheral output device may be able to play media playback information, application screens for applications implemented on the control units 140, 144, 150, and 208, information regarding ongoing communications operations, information regarding incoming communications requests, or device operation screens, to name only a few.

In some embodiments, the communications interface may comprise any suitable hardware, software, or combination of hardware and software that is capable of coupling the control units 140, 144, 150, and 208 to one or more networks and/or additional devices. The communications interface may be arranged to operate with any suitable technique for controlling information signals using a desired set of communications protocols, services or operating procedures. The communications interface may comprise the appropriate physical connectors to connect with a corresponding communications medium, whether wired or wireless.

Systems and methods of communication comprise a network, in accordance with some embodiments. In various aspects, the network may comprise local area networks (LAN) as well as wide area networks (WAN) including without limitation Internet, wired channels, wireless channels, communication devices including telephones, computers, wire, radio, optical or other electromagnetic channels, and combinations thereof, including other devices and/or components capable of/associated with communicating data. For example, the communication environments comprise in-body communications, various devices, and various modes of communications such as wireless communications, wired communications, and combinations of the same.

Wireless communication modes comprise any mode of communication between points (e.g., nodes) that utilize, at least in part, wireless technology including various protocols and combinations of protocols associated with wireless transmission, data, and devices. The points comprise, for example, wireless devices such as wireless headsets, audio and multimedia devices and equipment, such as audio players and multimedia players, telephones, including mobile telephones and cordless telephones, and computers and computer-related devices and components, such as printers, network-connected machinery, and/or any other suitable device or third-party device.

Wired communication modes comprise any mode of communication between points that utilize wired technology including various protocols and combinations of protocols associated with wired transmission, data, and devices. The points comprise, for example, devices such as audio and multimedia devices and equipment, such as audio players and multimedia players, telephones, including mobile telephones and cordless telephones, and computers and computer-related devices and components, such as printers, network-connected machinery, and/or any other suitable device or third-party device. In various implementations, the wired communication modules may communicate in accordance with a number of wired protocols. Examples of wired protocols may comprise Universal Serial Bus (USB) communication, RS-232, RS-422, RS-423, RS-485 serial protocols, FireWire, Ethernet, Fiber Channel, MIDI, ATA, Serial ATA, PCI Express, T-1 (and variants), Industry Standard Architecture (ISA) parallel communication, Small Computer System Interface (SCSI) communication, or Peripheral Component Interconnect (PCI) communication, to name only a few examples.

Accordingly, in various aspects, the communications interface may comprise one or more interfaces such as, for example, a wireless communications interface, a wired communications interface, a network interface, a transmit interface, a receive interface, a media interface, a system interface, a component interface, a switching interface, a chip interface, a controller, and so forth. When implemented by a wireless device or within wireless system, for example, the communications interface may comprise a wireless interface comprising one or more antennas, transmitters, receivers, transceivers, amplifiers, filters, control logic, and so forth.

In various embodiments, the communications interface may provide voice and/or data communications functionality in accordance a number of wireless protocols. Examples of wireless protocols may comprise various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may comprise various wireless wide area network (WWAN) protocols, such as GSM cellular radiotelephone system protocols with GPRS, CDMA cellular radiotelephone communication systems with 1×RTT, EDGE systems, EV-DO systems, EV-DV systems, HSDPA systems, and so forth. Further examples of wireless protocols may comprise wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may comprise near-field communication techniques and protocols, such as electromagnetic induction (EMI) techniques. An example of EMI techniques may comprise passive or active radio-frequency identification (RFID) protocols and devices. Other suitable protocols may comprise Ultra Wide Band (UWB), Digital Office (DO), Digital Home, Trusted Platform Module (TPM), ZigBee, and so forth.

In some embodiments, the control units 140, 144, 150, and 208 may comprise a system bus that couples various system components including the processor, the memory, and the I/O interface. The system bus can be any of several types of bus structure(s) including a memory bus or memory controller, a peripheral bus or external bus, and/or a local bus using any variety of available bus architectures including, but not limited to, 9-bit bus, Industrial Standard Architecture (ISA), Micro-Channel Architecture (MCA), Extended ISA (EISA), Intelligent Drive Electronics (IDE), VESA Local Bus (VLB), Personal Computer Memory Card International Association (PCMCIA) Bus, Small Computer System Interface (SCSI) or other proprietary bus, or any custom bus suitable for computing device applications.

Figure 3:
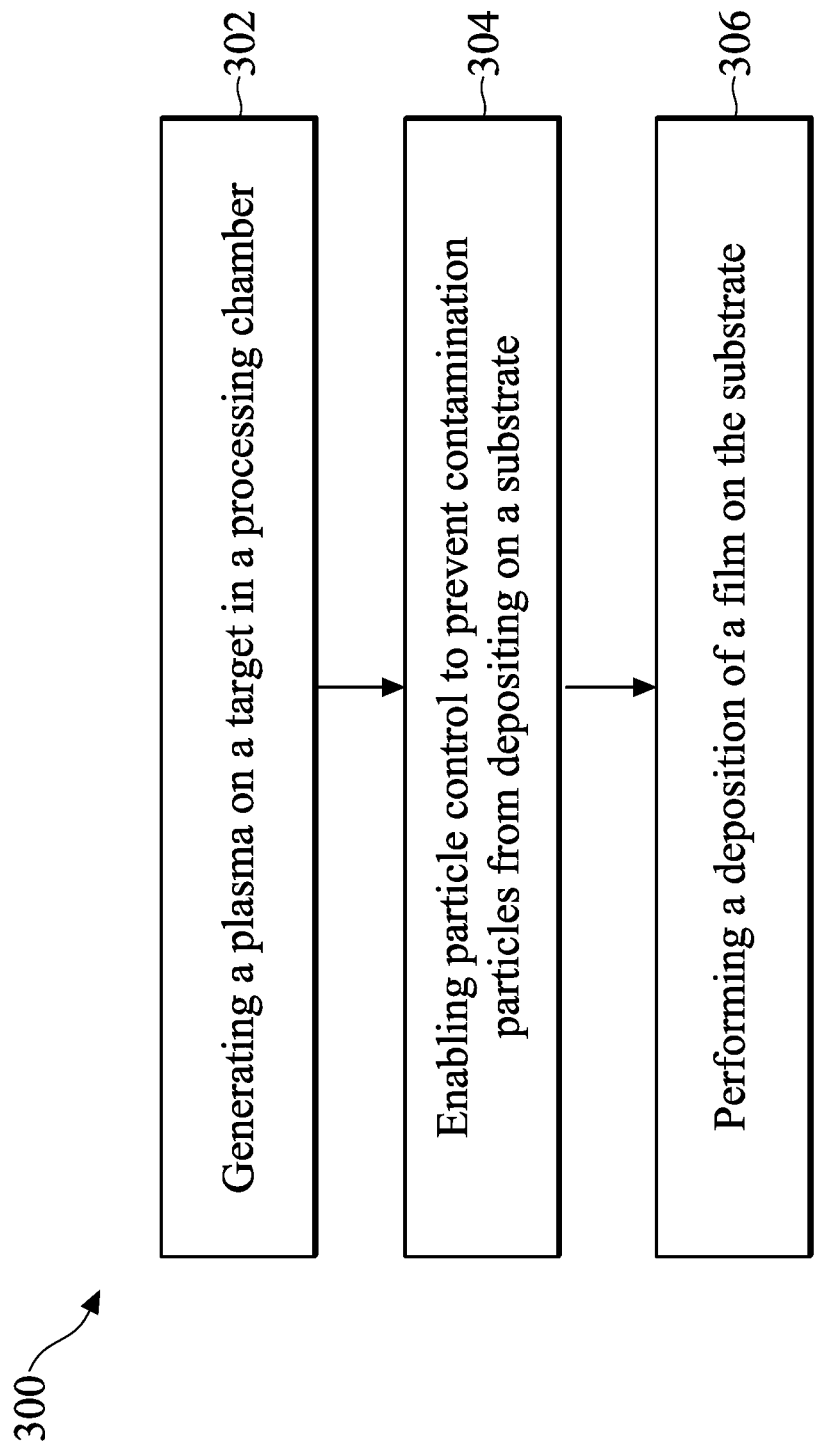
FIG. 3 illustrates a flowchart of a method for removing contamination particles using a particle control system in a physical vapor deposition process, in accordance with some embodiments of the present disclosure.

FIG. 3 illustrates a flowchart of a method 300 for removing contamination particles using a particle control system 160 in a physical vapor deposition process, in accordance with some embodiments of the present disclosure. It is understood that additional operations may be provided before, during, and after the method 300 of FIG. 3, and also some operations may be omitted or reordered.

The method 300 starts with operation 302 in which a plasma is generated in a processing chamber 102 according to some embodiments. In some embodiments, the plasma is generated on a plasma cathode 106 with a target 104. In some embodiments, before generating the plasma, process gas (e.g., Ar) is added to the processing chamber 102 through at least one gas-feeding port 120 and pumped out by a pump through at least one vacuum port 122 to prepare the processing chamber 102 to a desired pressure. In some embodiments, the desired pressure is in a pressure of a few millitorr (mTorr) to a few Torr. In some other embodiments, the at least one plasma cathode 106 is coupled to a radio frequency (RF) power source and a respective matching circuit (not shown) operating at frequencies from a few tens of kilohertz (KHz) to tens of megahertz (MHz). By applying a power on the at least one plasma cathode 106, a plasma 128 (i.e., a gas that contains ionized atoms or molecules) can be formed in a space in the processing chamber 102 near the at least one target 104. In some embodiments, technologies, such as for instance inductively coupled plasma, electron cyclotron resonance, microwave, and helicon wave can be integrated with the RF source for a creation of high-density discharges for desired deposition properties. In some embodiments, the physical vapor deposition system can be a DC magnetron sputtering system configured in a cathode target/anodic shield arrangement, wherein the at least one plasma cathode 106 and anode (not shown) are connected to a DC discharge power supply 112. In some embodiments, the at least one target 104 and the at least one corresponding plasma cathode 106 can be cooled by a coolant running behind the target 104.

The method 300 continues with operation 304 in which a particle control system 160 is enabled to remove contamination particles from depositing on a substrate 108 according to some embodiments. In some embodiments, the particle control system 160 comprises at least one magnet pair 130 configured inside the processing chamber 102. In some embodiments, the at least one magnet pair 130 each comprises two electromagnets 130A and 130B with magnetic coils configured facing each other on the opposite side of the processing chamber 102. Each of the electromagnets comprise a conductive wire coil that acts as a magnet when an electric current passes through it. In some embodiments, the conductive wire coil is wrapped around a core of ferromagnetic materials which can be used to enhance the magnetic field produced by the coil. In some embodiments, the at least one magnet pair 130 is coupled to a power source 138 and further to a control unit 140. In some embodiments, the control unit 140 and the power source 138 are configured to control a magnitude and a direction of an electric current running through the magnetic coils of the two electromagnets 130A/130B in each of the at least one magnet pair 130 to adjust a strength and a direction of the magnetic field 132. A magnetic force is induced by the magnetic field 132 on a moving and charged particle from the target 104. For example, a target atom 124 for deposition on the substrate 108 and a contamination particle 126 are bombarded off the surface of the target 104. In some embodiments, the target atom 124 and the contamination particle 126 each has an initial trajectory 146 without a magnetic field 132. When the magnetic field 132 with a direction from a first electromagnet 130A to a second electromagnet 130B is enabled, the target atom 124 and the contamination particle 126 change from the first trajectory to a second trajectory 134 and 136, respectively. The difference between the original trajectory and the second trajectory of the target atom 124 is greater than that of the contamination particle 126 caused by differences between the 2 particles, e.g., mass and electric charges. Therefore, the magnetic force can separate contamination particles from the rest of the target atoms 124. In some embodiments, the magnet pairs are arranged around the inner wall of the processing chamber 102 and each of the magnetic pairs 130 has a 2-fold rotational symmetry about the center of the processing chamber 102. In some embodiments, at least one target 104 is located at the center of the processing chamber 102. In some embodiments, the wafer stage 110 with a substrate 108 is off the center of the processing chamber 102 and located at the top of the processing chamber in a top view so as to collect target atoms that are shifted by the magnetic field 132 generated by the magnet pairs 130.

In some other embodiments, the particle control system 160 comprises at least one electrode pair 202 configured inside the processing chamber 102. In some embodiments, the at least one electrode pair 202 each comprises two electrodes 202A and 202B with electrodes configured facing each other on the opposite side of the processing chamber 102. Each of the electrode pair 202 acts as a capacitor when an electric potential is applied between the two electrodes. In some embodiments, the at least one electrode pair 202 is coupled to a power source 204 and further to a control unit 208. In some embodiments, the control unit 208 and the power source 204 are configured to control a magnitude and a polarity of the electric potential so as to control a strength and a direction of an electric field between the two electrodes 202A/202B. An electrostatic force is induced by the 2 electrodes on a moving and charged particle from the target 104. For example, the target atom 124 for deposition on the substrate 108 and the contamination particle 126 are bombarded off the surface of the target 104. In some embodiments, the target atom 124 and the contamination particle 126 each has an initial trajectory 146 when there is no electric field 206 is provided by the 2 electrodes 202A/202B. When the electric field 206 with a direction from a first electrode 202A to a second electrode 202B is enabled, both of the target atom 124 and the contamination particle 126 change from the first trajectory 146 to a second trajectory 134 and 136, respectively. The difference between the original trajectory and the second trajectory of the target atom 124 is greater than that of the contamination particle 126 caused by differences between the 2 particles, e.g., mass and electric charges. Therefore, the electrostatic force can change the original trajectories of charged particles and thus separate contamination particles from the rest of the target atoms 124.

The method 300 continues with operation 306 in which a deposition of a film is performed on the substrate 108 according to some embodiments. In some embodiments, the film deposited on the substrate 108 comprises at least one element from the target 104. In some embodiments, a number of defects in the film caused by contamination particles 126 is reduced by the particle control system 160 in the present disclosure. In some embodiments, the particle control system 160 provides an efficient separation of contamination particles from the target atoms and together with the positioning of the substrate, it can further allow target atoms to reach the surface of the substrate. The substrate 108 may be a bulk silicon substrate although other semiconductor materials including group III, group IV, and group V elements may also be used. Alternatively, the substrate 108 may be a silicon-on-insulator (SOI) substrate. In some embodiments, a device layer may be a polysilicon layer disposed on a substrate (not shown) for the formation of one or more polysilicon gates in the substrate 108. In another embodiment, the device layer may be a metallization layer such as an inter-layer dielectric (ILD) or an inter-metal dielectric layer (IMD) for forming interconnect structures (e.g., metal lines and/or vias). In yet other embodiments, the device layer may be any layer in the substrate 108 that may be patterned using photolithography and etching processes. The substrate 108 may include numerous device layers. Furthermore, the device layer may include a buffer layer (e.g., an oxide interfacial layer, not shown), an etch stop layer (e.g., a silicon nitride layer, a silicon carbide layer, or the like), or the like. A hard mask may be formed over the device layer for use as a patterning mask. The hard mask may comprise an oxide, silicon oxynitride (SiON), silicon nitride ($Si_3N_4$), titanium nitride (TiN), or the like.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the inventive concepts, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is set to be understood in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

In an embodiment, a film deposition system includes: a processing chamber sealable to create a pressurized environment and configured to contain a plasma, a target and a substrate in the pressurized environment; and a particle control unit, wherein the particle control unit is configured to provide an external force to each of at least one charged atom and at least one contamination particle in the plasma, wherein the at least one charged atom and the at last one contamination particle are generated by the target when it is in direct contact with the plasma, wherein the external force is configured to direct the at least one charged atom to a top surface of the substrate and to direct the at least one contamination particle away from the top surface of the substrate.

In another embodiment, a method for particle control in a film deposition system includes: providing a plasma to be in direct contact with at least one target in a processing chamber, thereby generating at least one charged atom and at least one contamination particle; generating an external force on each of the at least one charged atom and the at least one contamination particle in the plasma so as to direct the at least one charged atom to a substrate; and directing the at least one charged atom onto a surface of the substrate at a first position, wherein the first position is configured by a substrate stage located off-center of the processing chamber.

Yet in another embodiment, a film deposition system, includes: a processing chamber sealable to create a pressurized environment and configured to contain a plasma, a target and a substrate in the pressurized environment; and a particle control unit, wherein the particle control unit is configured to provide an external force to each of at least one charged atom and at least one contamination particle in the plasma, wherein the at least one charged atom and the at last one contamination particle are generated by the target when it is in direct contact with the plasma, wherein the external force is configured to direct the at least one charged atom to a top surface of the substrate and to direct the at least one contamination particle away from the top surface of the substrate, wherein the substrate is supported by a stage that is off-center from a center of the processing chamber, and wherein the particle control unit comprises one of the following: at least one pair of electromagnetic coils and at least one pair of conductive electrodes.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A film deposition system comprising:
   a processing chamber sealable to create a pressurized environment and configured to contain a plasma, a target and a substrate in the pressurized environment; and
   a particle control unit, wherein the particle control unit is configured to provide an external force to each of at least one charged atom and at least one contamination particle in the plasma, wherein the at least one charged atom and the at last one contamination particle are generated by the target when it is in direct contact with the plasma,
   wherein the external force is configured to direct the at least one charged atom to a top surface of the substrate and to direct the at least one contamination particle away from the top surface of the substrate,
   wherein the particle control unit comprises one of the following: at least one pair of electromagnetic coils and at least one pair of conductive electrodes, and
   wherein the at least one pair of conductive electrodes is configured to provide an electric field between a first conductive electrode and a second conductive electrode in the particle control unit.

2. The system of claim 1, wherein the at least one pair of electromagnetic coils or the at least one pair of conductive electrodes comprises at least one of the following: iron and manganese.

3. The system of claim 1, wherein the at least one pair of electromagnetic coils or the at least one pair of conductive electrodes is configured near the at least one target in a 2-fold rotational symmetry about the center of the processing chamber.

4. The system of claim 1, wherein the at least one pair of electromagnetic coils or the at least one pair of conductive electrodes has a shape of one of the following: square and circular.

5. The system of claim 1, wherein the at least one pair of electromagnetic coils is configured to provide a magnetic field between a first electromagnetic coil and a second electromagnetic coil.

6. A method for particle control in a film deposition system comprising:
   providing a plasma to be in direct contact with at least one target in a processing chamber, thereby generating at least one charged atom and at least one contamination particle;
   generating an external force on each of the at least one charged atom and the at least one contamination particle in the plasma so as to direct the at least one charged atom to a substrate; and
   directing the at least one charged atom onto a surface of the substrate at a first position, wherein the first position is configured by a substrate stage located off-center of the processing chamber.

7. The method of claim 6, wherein the external force is provided by one of the following: at least one pair of electromagnetic coils and at least one pair of conductive electrodes.

8. The method of claim 7, wherein the at least one pair of electromagnetic coils or the at least one pair of conductive electrodes comprises at least one of the following: iron and manganese.

9. The method of claim 7, wherein the at least one pair of electromagnetic coils or the at least one pair of conductive electrodes is configured near the at least one target with a 2-fold rotational symmetry about the center of the processing chamber.

10. The method of claim 7, wherein the at least one pair of electromagnetic coils or the at least one pair of conductive electrodes has a shape of one of the following: square and circular.

11. The method of claim 7, wherein the at least one pair of conductive electrodes is configured to provide an electric field between a first conductive electrode and a second conductive electrode in the particle control unit.

12. The method of claim 7, wherein the at least one pair of electromagnetic coils is configured to provide a magnetic field between a first electromagnetic coil and a second electromagnetic coil.

13. A film deposition system comprising:
    a processing chamber sealable to create a pressurized environment and configured to contain a plasma, a target and a substrate in the pressurized environment; and
    a particle control unit, wherein the particle control unit is configured to provide an external force to each of at least one charged atom and at least one contamination particle in the plasma, wherein the at least one charged atom and the at last one contamination particle are generated by the target when it is in direct contact with the plasma,
    wherein the external force is configured to direct the at least one charged atom to a top surface of the substrate and to direct the at least one contamination particle away from the top surface of the substrate, wherein the substrate is supported by a stage that is off-center from a center of the processing chamber, and wherein the particle control unit comprises one of the following: at least one pair of electromagnetic coils and at least one pair of conductive electrodes,
    wherein the at least one pair of conductive electrodes is configured to provide an electric field between a first conductive electrode and a second conductive electrode in the particle control unit.

14. The system of claim 13, wherein the at least one pair of electromagnetic coils or the at least one pair of conductive electrodes comprises at least one of the following: iron and manganese.

15. The system of claim 13, wherein the at least one pair of electromagnetic coils or the at least one pair of conductive electrodes is configured near the at least one target in a 2-fold rotational symmetry about the center of the processing chamber.

16. The system of claim 13, wherein the at least one pair of electromagnetic coils or the at least one pair of conductive electrodes has a shape of one of the following: square and circular.

17. The system of claim 13, wherein the at least one pair of electromagnetic coils is configured to provide a magnetic field between a first electromagnetic coil and a second electromagnetic coil.

18. The system of claim 13, wherein the at least one pair of electromagnetic coils comprises manganese.

19. The system of claim 13, wherein the at least one pair of electromagnetic coils is configured near the at least one target in a 2-fold rotational symmetry about the center of the processing chamber.

20. The system of claim 13, wherein the at least one pair of electromagnetic coils has a circular shape.

* * * * *